United States Patent
Singh et al.

(10) Patent No.: US 8,124,300 B1
(45) Date of Patent: Feb. 28, 2012

(54) METHOD OF LITHOGRAPHIC MASK CORRECTION USING LOCALIZED TRANSMISSION ADJUSTMENT

(75) Inventors: Bhanwar Singh, Morgan Hill, CA (US); Luigi Capodieci, Santa Cruz, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1466 days.

(21) Appl. No.: 10/999,404

(22) Filed: Nov. 30, 2004

(51) Int. Cl.
*G03F 1/00* (2006.01)

(52) U.S. Cl. .............................. 430/5; 430/30

(58) Field of Classification Search ................. 430/5, 30
See application file for complete search history.

(56) References Cited

U.S. PATENT DOCUMENTS

| | | | |
|---|---|---|---|
| 5,165,954 A | 11/1992 | Parker et al. | |
| 5,355,212 A * | 10/1994 | Wells et al. | 356/237.4 |
| 5,795,688 A * | 8/1998 | Burdorf et al. | 430/30 |
| 5,932,377 A * | 8/1999 | Ferguson et al. | 430/5 |
| 5,962,173 A * | 10/1999 | Leroux et al. | 430/5 |
| 6,016,357 A * | 1/2000 | Neary et al. | 382/144 |
| 6,197,455 B1 | 3/2001 | Yedur et al. | |
| 6,340,543 B1 * | 1/2002 | Nagamura et al. | 430/5 |
| 6,472,760 B1 | 10/2002 | Birdsley et al. | |
| 6,566,888 B1 | 5/2003 | Bruce et al. | |
| 2001/0051303 A1 * | 12/2001 | Choi et al. | 430/5 |
| 2002/0045110 A1 * | 4/2002 | Ohnuma | 430/5 |
| 2002/0076654 A1 * | 6/2002 | Hasegawa et al. | 430/311 |
| 2002/0122992 A1 * | 9/2002 | Kanamitsu | 430/5 |
| 2003/0039895 A1 * | 2/2003 | Choi | 430/5 |
| 2004/0157134 A1 * | 8/2004 | Kim et al. | 430/5 |

* cited by examiner

*Primary Examiner* — Mark F Huff
*Assistant Examiner* — Stewart Fraser
(74) *Attorney, Agent, or Firm* — Farjami & Farjami LLP

(57) ABSTRACT

A method of correcting a lithographic mask is disclosed. The method can include detecting a location of the mask that corresponds to a wafer location having a structure that is printed with a larger than desired dimension and reducing a thickness of at least a portion of a mask feature corresponding to the wafer structure to locally increase transmissivity of the mask feature.

20 Claims, 2 Drawing Sheets

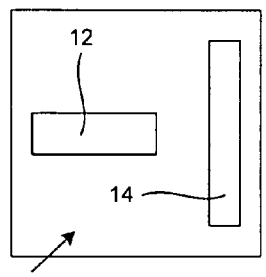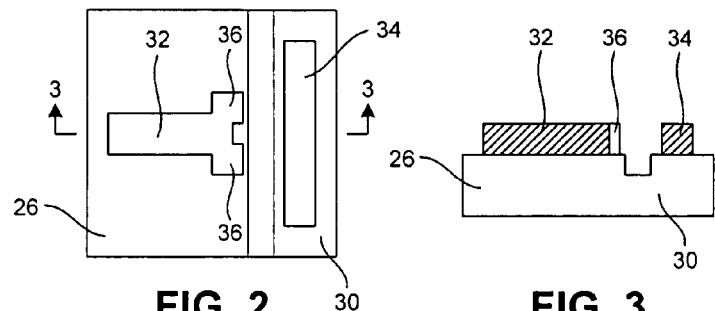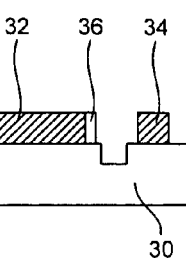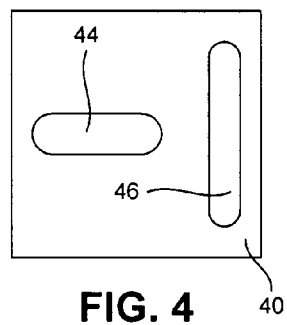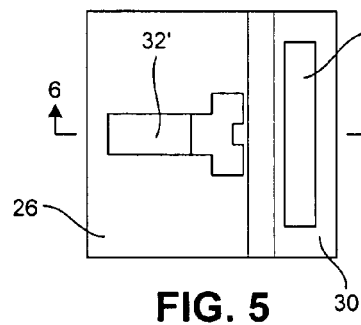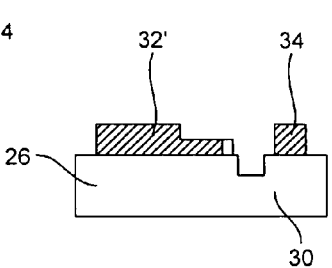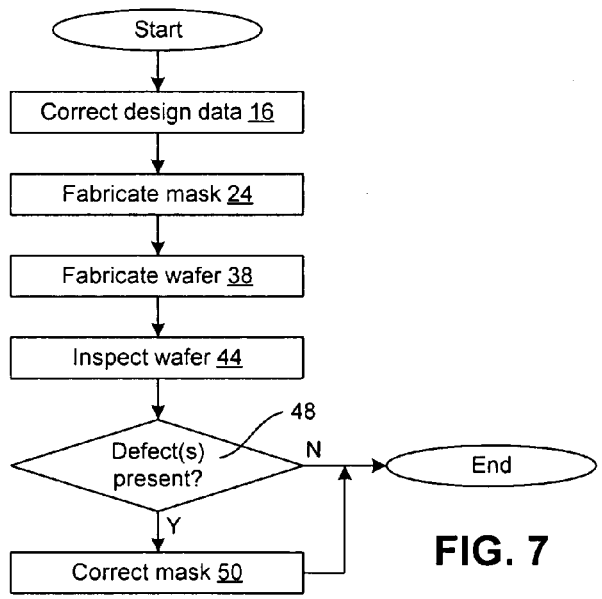

US 8,124,300 B1

METHOD OF LITHOGRAPHIC MASK CORRECTION USING LOCALIZED TRANSMISSION ADJUSTMENT

TECHNICAL FIELD

The present invention relates generally to the field of integrated circuit manufacture. More particularly, the present invention relates to a method for correcting a lithographic mask, such as an attenuated phase shift mask (PSM), using localized transmission adjustment to achieve a desired process margin.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, lithography can be used to form a pattern in a photoresist layer that is disposed over a layer to be processed. Example underlying layers to be processed include a semiconductor layer, a metal or metal containing layer, a dielectric layer, a hard mask layer, and so forth. In the lithography process, a mask is provided that has a pattern corresponding to the desired pattern for the photoresist. Light energy is passed through a mask to image the desired pattern onto the photoresist layer. As a result, the pattern of the mask is transferred to the photoresist layer. After the photoresist is sufficiently exposed to the light energy and after a development cycle, the photoresist material can become selectively soluble such that portions of the photoresist can be removed to selectively expose the underlying layer to be processed. Portions of the photoresist layer that are not removed serve to protect the underlying layer during further processing of the wafer. Such further processing of the wafer can include, for example, etching exposed portions of the underlying layer, implanting ions into the wafer, and so forth. Thereafter, the remaining portions of the photoresist layer can be removed.

There is a pervasive trend in the art of IC fabrication to increase the density with which various structures are arranged. As a result, there is an ever decreasing amount of process margin in the techniques used to make the ICs. As an example, optical proximity correction (OPC) may be used to correct mask design data to compensate for a variety of phenomena that may occur during imaging and processing of the photoresist, among other process related variables. OPC can generally be used to compensate for optical proximity effects such as line end pullback, corner rounding, line width variations and so forth. Using the problem of line end pullback as an example, some common OPC techniques may add a "hammer-head" or serif(s) to a corresponding line to reduce the amount of line end pullback experienced during imaging of the photoresist. However, if actual process conditions during the imaging and development of the photoresist differ slightly from the process conditions assumed during the execution of the OPC routine, the end of the line may actually print closer to another feature than is desired. If the line and other feature are spaced too closely to one another, performance of the resulting integrated circuit may be compromised.

By the time a mask for patterning a particular layer of an IC is fabricated, an enormous amount of resources have been expended. Redesigning the mask may be impractical and/or can considerably delay fabrication of the IC. Accordingly, there exists a need in the art for techniques to correct a previously fabricated lithographic mask to achieve a desired process margin.

SUMMARY OF THE INVENTION

According to one aspect of the invention, the invention is directed to a method of correcting a lithographic mask. The method can include detecting a location of the mask that corresponds to a wafer location having a structure that is printed with a larger than desired dimension and removing a portion of a mask feature corresponding to the wafer structure.

According to another aspect of the invention, the invention is directed to a method of correcting a lithographic mask. The method can include detecting a location of the mask that corresponds to a wafer location having a structure that is printed with a larger than desired dimension and reducing a thickness of at least a portion of a mask feature corresponding to the wafer structure to locally increase transmissivity of the mask feature.

BRIEF DESCRIPTION OF DRAWINGS

These and further features of the present invention will be apparent with reference to the following description and drawings, wherein:

FIG. 1 is a graphical representation of design data for a portion of an IC layout;

FIG. 2 is a top view of a portion of a mask made in accordance with a corrected version of the design data of FIG. 1;

FIG. 3 is a cross-section of the portion of the mask of FIG. 2 taken along the line 3-3;

FIG. 4 is a top view of a portion of a wafer made using the mask of FIG. 2;

FIG. 5 is a top view of the portion of the mask of FIG. 2 following correction to adjust localized transmission;

FIG. 6 is a cross-section of the portion of the mask of FIG. 5 taken along the line 6-6;

FIG. 7 is a flow diagram of a method of correcting a mask using localized transmission adjustment;

DISCLOSURE OF INVENTION

Figure 8:
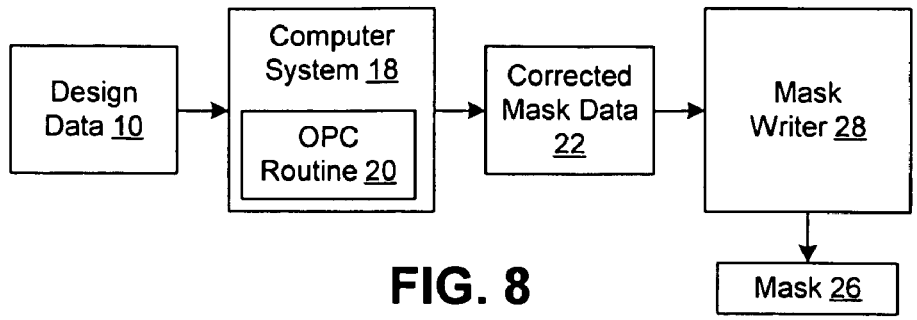
FIG. 8 is a block diagram of a system for making a mask.

In the detailed description that follows, similar components have been given the same reference numerals, regardless of whether they are shown in different views and/or embodiments. To illustrate the various aspects of the present invention(s) in a clear and concise manner, the drawings may not necessarily be to scale and certain features may be shown in somewhat schematic form.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, superconductor switches, micro electro-mechanical systems (MEMS) and so forth.

The apparatus and methods described herein can provide for enhancing the process margin of lithographic techniques used to fabricate a microdevice, such as an IC. More specifically, a mask used in the imaging of a wafer can be corrected using localized transmission adjustment. The localized transmission adjustment can be used, for example, to compensate for differences between process assumptions made during correction of mask data that specifies a pattern of the mask and actual process conditions when the mask is employed to image a wafer. In this manner, the process margin of wafer fabrication can be adjusted to be more tolerant of process related factors, such as depth of focus, exposure dose, photoresist processing, and so forth.

As a specific example of process margin adjustment, the description herein is presented in the context of using localized transmission adjustment of a mask to optimize an amount of line end pullback for a line to be printed on a wafer. As should be appreciated, the techniques described herein can apply to mask corrections to optimize other conditions that could be effected by process margin. Other conditions can include, for example, corner rounding, feature bridging, line width variation, and other optical proximity phenomena encountered during lithography.

In the example of mask correction for line end pullback, mask design data can be corrected using a technique that predicts and/or accounts for optical proximity effects encountered when imaging a wafer with a mask fabricated in accordance with the mask design data. One such correction technique is optical proximity correction (OPC). During the correction process, a line of the mask design data may be enhanced to reduce the amount of line end pullback that might occur during imaging of the wafer. Even with the correction, some line end pullback may be expected. Nevertheless, the line end may print to be longer than expected (e.g., the line may not experience an amount of expected line end pullback or may print to be longer than the corresponding mask design data). In some instances, a longer than expected line may be printed as a result of certain process related conditions present during imaging and/or processing of the wafer. To compensate for the longer than expected line and/or the process related conditions, the light transmission qualities of the mask feature used to define the line during imaging of the wafer can be altered. For instance, a focused ion beam or controlled laser beam can be used to remove an upper portion of mask material to allow greater light transmission by an end portion of the mask feature that corresponds to the line.

In the example presented herein, a clear-field mask (e.g., a positive mask having generally transparent background with opaque features) is used to image a positive tone photoresist. In the example, the mask is an attenuate phase shit mask (PSM). As will be appreciated, the techniques used to correct the mask can be modified for use with dark-field masks used to image a negative tone photoresist. In addition, masks other than attenuated PSMs can be corrected using the techniques described herein.

Referring now to FIG. 1, illustrated is a graphical representation of design data 10 for a portion of an IC layout. For example, the design data 10 can represent a section of desired layout for a layer of material that forms part of the IC. The illustrated example shows a line 12 adjacent a feature 14. Although the illustrated portion of the design data 10 shows just two structures from a desired layout, it will be recognized that the design data 10 can include thousands or millions of structures. The layout design data 10 can be embodied in an electronic database and expressed in a format used to represent geometrical data, such as a GDSII file. Electronic files used to represent a layout are often referred to in the art as "technology files," or "tech files." Therefore, the electronic file for the desired layout can be referred to as a design data tech file.

With additional reference to FIG. 7, shown is a flow diagram of a method of correcting a mask using localized transmission adjustment. The method can start in block 16 where the design data 10 is corrected for various optical proximity effects and lithography process considerations to derive a corrected mask data set corresponding to the design data 10. Also with reference to FIG. 8, shown is a block diagram of a system for making a mask. In one embodiment, the design data 10 is input to a computer system 18 that is configured to execute an OPC routine 20. The OPC routine 20 manipulates the design data 10 and outputs a corrected mask data set 22.

As indicated, OPC can be used to prepare a desired layout before the layout is embodied onto a reticle in an attempt to improve image fidelity when the reticle is used to image a wafer. In general, current OPC techniques involve executing an OPC software program with accompanying OPC scripts. The OPC program/scripts carry out a computer simulation that takes the initial data set 10 having information relating the desired pattern and manipulates the data set 10 to arrive at a corrected data set in an attempt to compensate for factors such as optical proximity effects and photoresist processing. Some of the more prevalent concerns include line end pullback, corner rounding and line-width variations. These concerns are largely dependent on local pattern density and topology. The reticle can then be made in accordance with the corrected data set. Briefly, the OPC process can be governed by a set of optical rules (e.g., "rule-based OPC" employing fixed rules for geometric manipulation of the data set), a set of modeling principles (e.g., "model-based OPC" employing predetermined behavior data to drive geometric manipulation of the data set) or a hybrid combination of rule-based OPC and model-based OPC.

The OPC can be carried out on the design data 10 to correct for distortions occurring during imaging of the wafer. Briefly, the OPC process can involve iteratively refining the design data 10 using an edge placement error (EPE) value as a benchmark for the compensating process. For instance, the features and lines of the desired (or target) pattern are broken into edge fragments (or edge segments). The fragmented data set is manipulated based on the rules and/or the models. As part of the correction process, the edge fragments can be moved inward or outward. Then, a simulation can be run to determine predicted placement of the edges by simulated "imaging" (or "printing") of the manipulated pattern onto a wafer. The predicted edges are compared against their desired placement; and, when the simulation of the printing of the test pattern converges upon the desired layout with acceptable limits, the OPC routine can end. Upon completion, the OPC simulation tool can output a corrected mask data 22, such as in the form of a final mask tech file.

With additional reference to FIG. 2, after the corrected mask data 22 is established, the method depicted in FIG. 7 can continue in block 24 where the corrected mask data 22 can be used to fabricate a corresponding mask 26. For instance, the computer system 18 can transfer the corrected mask data 22 to a pattern generator, or mask writer 28 (FIG. 8). In turn, the mask writer 28 can write the pattern defined in the corrected mask data 22 a mask blank, which is then processed to form the final mask 26 using appropriate reticle manufacturing techniques.

The mask 26 can include a substrate 30 that is made from, for example, quartz. A first structure 32 and a second structure 34 that respectively correspond to the line 12 and the feature 14 of the design data can be formed over the substrate from an opaque film. The opaque film and the resulting structures 32 and 34 can be made from, for example, chrome. As should be understood, the terms opaque film or opaque material as used herein includes compositions that do not completely block radiation having a wavelength(s) used to image a wafer during lithographic processing of the wafer. Rather, the term opaque can include the partial transmission of the exposure wavelength(s) and such transmission can, in part, be dependent on the thickness of the opaque material. As indicated, the mask 26 can be an alternating PSM and can include trenches in the substrate 30 and/or mesa structures. By example, a trench is shown in FIGS. 2 and 3.

The line 32 can include aspects that were added to the design data 10 during correction of the design data 10 to compensate for line end pullback. In the illustrated example, the corrective aspects are in the form of serifs 36. As should be appreciated, the addition of the serifs 36 is exemplary and additional or alternative corrections can be made to the design data 10 to compensate for line end pullback or other optical proximity effects.

Figure 9:
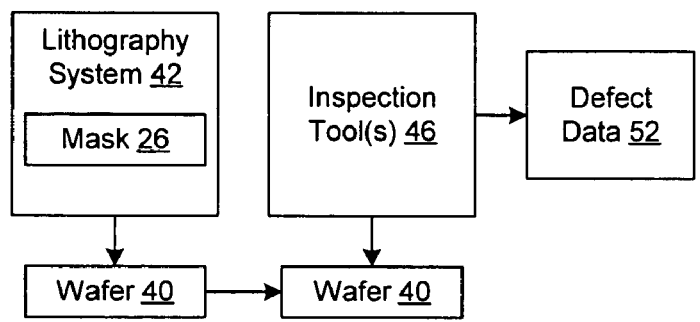
FIG. 9 is a block diagram of a system for making and inspecting a wafer.

With reference now to FIGS. 4, 7 and 9, the method can continue in block 38 where a wafer 40 is fabricated using the mask 26. During processing, the wafer 40 can include a layer of photoresist disposed over a layer to be processed, referred to as an underlying layer. The photoresist layer is exposed using a lithography system 42 that includes the mask 26, which is used to define the exposure pattern. After the photoresist layer is exposed, the photoresist layer can be developed and the underlying layer can be etched to leave a line 44 adjacent a structure 46. The line 44 corresponds to the mask line 32 and the structure 46 corresponds to the mask feature 34. For purposes of mask 26 correction, it is noted that an entire IC need not be made in block 38 and it should be understood that the wafer fabrication of block 38 can relate to as little as fabrication of structures corresponding to the pattern of the mask 26.

The lithography system 42 can be, for example, a step-and-repeat ("stepper") exposure system or a step-and-scan ("scanner") exposure system, but is not limited to these example systems. Although not illustrated in detail, the lithography system 42 can include a radiation (e.g., light) source, or illuminator, for directing energy towards the mask 26. The energy can have, for example, a deep ultraviolet wavelength (e.g., about 248 nm or about 193 nm), or a vacuum ultraviolet (VUV) wavelength (e.g., about 157 nm), although other wavelengths, including extreme ultraviolet wavelengths, are possible.

The mask 26 selectively blocks (or, in some instances, selectively reflects) the energy such that an energy pattern defined by the mask 26 is transferred towards the wafer 40. An imaging subsystem, such as a stepper assembly or a scanner assembly, sequentially directs the energy pattern transmitted by the mask 26 to a series of desired locations on the wafer 40. The imaging subsystem may include lenses and/or reflectors for use in scaling and directing the energy pattern towards the wafer 40 in the form of an imaging energy pattern, or exposure dose.

After the wafer 40 is fabricated in block 38, the method can proceed to block 44 where the wafer 40 can be inspected. For example, the wafer 40 can be transferred to be scanned by one or more metrology or defect inspection tools 46, such as a critical dimension (CD) measurement tool. In the example of correcting the mask 26 for line end pullback to enhance margin, the distance from the end of the line 44 adjacent the structure 46 to the structure 46 can be measured. Thereafter, in block 48, a determination can be made as to whether there is a defect present on the wafer 40. In the line end pullback example, if the end of the line 44 is too close to the structure 46 then a defect can be considered to be present. If no defects are present, the method can end. Otherwise, the method can proceed to block 50 where the defect in the mask 26 is corrected using localized transmission adjustment.

Correction of the mask in block 50 can include outputting or deriving defect data 52 from the inspection tool(s) 46. The defect data 52 can include information relating to the location of the defect on the wafer 40. The defect data 52 can also quantify the defect, such as indicating the distance between the end of the line 44 and the structure 46 or indicating the difference between a measured quantity and a corresponding specification value.

Figure 10:
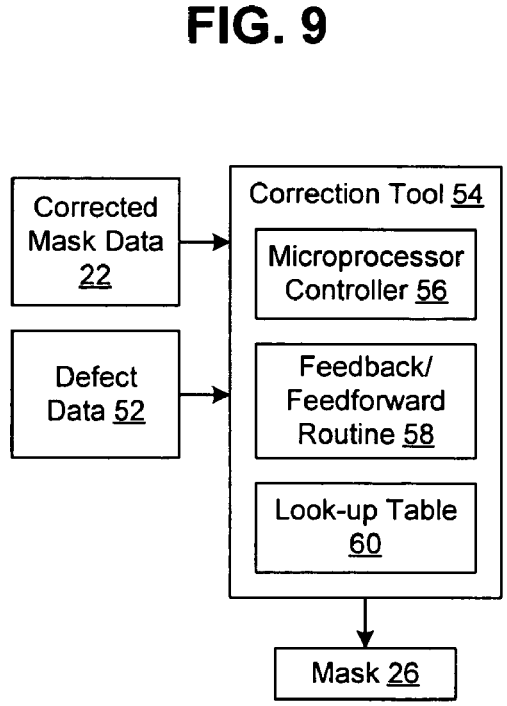
FIG. 10 is a block diagram of a system for correcting a mask.

With additional reference to FIG. 10, the corrected mask data 22 and the defect data 52 can be input to a correction tool 54. The correction tool 54 should be capable of partially removing portions of the mask 26 as described herein. Various nanomachining devices can be used for the correction tool 54 and include, for example, a focused ion beam (FIB) assembly and a controlled laser assembly (e.g., a laser assembly outputting a near-infrared (NIR) laser beam). The correction tool 54 can include or can be connected to a microprocessor controller 56 for executing a control routine and controlling operation of the correction tool 54. The control routine can include a feedback and/or feedforward routine 58 for effectuating precision mask 26 correction.

Correction of the mask 26 includes reducing the thickness of the opaque material of the mask 26 to increase the local transmission of the mask 26. For example, as shown in FIGS. 2 and 3, the line 32 (including the serifs 36) and the feature 34 can be made from an opaque film disposed on the substrate 30. The opaque film can be about 300 angstroms (Å) to about 1000 Å thick, for example. Therefore, the resulting line 32 and feature 34 can each have a thickness of about 300 Å to about 1000 Å.

With additional reference to FIGS. 5 and 6, shown is the mask 26 after localized transmission adjustment. More specifically, the correction tool 54 is used to locate the area of the mask 26 in which the defect was determined to be present. The location can be ascertained by comparing the defect data 52 with the corrected mask data 22 and then, under the control of the controller 56, moving the mask 26 such that the location is disposed for targeting by the output of the correction tool 54 (e.g., focused ion beam or laser beam). For this purpose, the correction tool 54 can be provided with navigational instruments. As is known in the art, the navigation instruments can be used in conjunction with the feedback/feedforward routine 58 to compare mask topology (e.g., features or alignment markings) with the corrected mask data 22 to result in proper positioning of the mask 26.

Once positioned, the correction tool 54 can direct ions (e.g., heavy metal ions) or radiation (e.g., laser light) towards the mask 26 to reduce the thickness of the opaque material forming the line 32, thereby increasing the transmission of the line 32. A resulting, or corrected, line 32' can be at least partially reduced in thickness such that when the mask 26 is used to image a wafer, a greater amount of energy is present in the exposure dose than if the line 32 was not altered. In the example of correcting the mask 26 to adjust line end pullback, the reduced thickness of the opaque material can result in more line end pullback such that the end of the printed line 44 (FIG. 4) is sufficiently spaced from the feature 46 (FIG. 4). The correction to the line 32 can be considered to partially counteract the correction to the design data 10 made during OPC. In the example, serifs 36 were added to reduced line end pullback, but the correction may have overcompensated for line end pullback given actual process variables encountered wafer fabrication.

As illustrated, the entire line 32 need not be reduced in thickness. Rather, the end portion of the line 32 (including characteristics added by OPC such as the illustrated serifs) in the location of the detected defect can be reduced in thickness. The corrected line 32' can have a stepped profile as best illustrated in FIG. 6. In one embodiment, the amount of opaque material removed can depend on the quantification of the defect. For example, a relationship between thickness of the opaque material and line end positioning can be established using, for example, empirical techniques. Using this information and the defect data 52, the controller 56 can control the correction tool 54 to remove a specified percentage of the original thickness of the opaque material.

The amount of material removed, including the size of the portion of the feature that is removed and/or the percentage of the original thickness of the opaque material removed, can be determined in any suitable manner. For example, results of experimental tests and/or calculated values based on known lithographic processing behavior can be stored in a look-up table 60. Using the defect data 52 as a quantification of the defect(s), the correction tool 54 can use the look-up table 60 to determine the amount (e.g., area and/or thickness) of the material to be removed. For instance, for one defect, the look-up table 60 may indicate that the correction tool 54 should remove twenty percent of the original thickness and, for another defect, the look-up table 60 may indicate that the correction tool 54 should remove twenty-three percent of the original thickness. The foregoing percentages are merely examples and, as will be appreciated, are not intended to limit the scope of the invention as defined by the claims appended hereto.

In addition to or instead of reducing the thickness of the opaque material, the correction tool 54 can be controlled to reshape the line 32. For example, the localized transmission adjustment can include partially or completely removing the corrective aspect added by OPC (e.g., the serifs 36 in the illustrated example).

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of correcting a mask for use in a lithographic process, said method comprising:
   utilizing a mask design corresponding to said mask;
   identifying a plurality of corrections to the mask design before fabrication of the mask;
   using the mask to pattern a wafer after fabrication of the mask;
   detecting a location of the mask that corresponds to a wafer location having a wafer structure that is printed with a larger than desired dimension; and
   removing a portion of a mask feature corresponding to the wafer structure;
   the removing serving to adjust at least one of the plurality of corrections identified prior to fabrication of the mask.

2. The method according to claim 1, wherein the removing locally increases transmissivity of the mask.

3. The method according to claim 2, wherein the removed portion of the mask feature is only in an area corresponding to the larger than desired dimension.

4. The method according to claim 1, wherein the removing is carried out with a focused ion beam.

5. The method according to claim 1, wherein the removing is carried out with a laser beam.

6. The method according to claim 1, wherein the detecting includes scanning the wafer for locations where the wafer structure is closer to a second wafer structure than is desired.

7. The method according to claim 1, wherein the detecting includes scanning the wafer for locations where the wafer structure has an amount of line end pullback that is less than desired.

8. The method according to claim 1, wherein the identifying is performed using optical proximity correction prior to fabrication of the mask.

9. The method according to claim 8, wherein the removing is carried out to adjust process margin for lithographic manufacture of the wafer.

10. A method of correcting a lithographic mask comprising:
    identifying a plurality of corrections to a mask design corresponding to the mask before fabrication of the mask;
    detecting a location of the mask that corresponds to a wafer location having a wafer structure that is printed with a larger than desired dimension; and
    reducing a thickness of at least a portion of a mask feature corresponding to the wafer structure to locally increase transmissivity of the mask feature without substantially removing the mask feature.

11. The method according to claim 10, wherein the mask feature is reduced in thickness only in an area corresponding to the larger than desired dimension.

12. The method according to claim 10, wherein the reducing is carried out with a focused ion beam.

13. The method according to claim 10, wherein the reducing is carried out with a laser beam.

14. The method according to claim 10, wherein the detecting includes scanning the wafer for locations where the wafer structure is closer to a second wafer structure than is desired.

15. The method according to claim 10, wherein the detecting includes scanning the wafer for locations where the wafer structure has an amount of line end pullback that is less than desired.

16. The method according to claim 10, wherein the identifying is performed using optical proximity correction prior to fabrication of the mask.

17. The method according to claim 16, wherein the reducing is carried out to adjust process margin for lithographic manufacture of the wafer.

18. The method according to claim 16, wherein the reducing is carried out to partially counteract a correction made by the optical proximity correction.

19. The method according to claim 16, wherein the reducing is carried out to compensate for a difference between process assumptions made by the optical proximity correction and actual process conditions when the mask is used to image the wafer.

20. The method according to claim 10, wherein the reducing is carried out to adjust process margin for lithographic manufacture of the wafer.

* * * * *